United States Patent [19]

Takano et al.

[11] Patent Number: 4,578,638
[45] Date of Patent: Mar. 25, 1986

[54] SPECTRUM ANALYZER

[75] Inventors: Mitsuyoshi Takano, Tokyo; Mamoru Ando, Hiratsuka, both of Japan

[73] Assignee: Anritsu Electric Co. Ltd., Tokyo, Japan

[21] Appl. No.: 583,020

[22] Filed: Feb. 23, 1984

[30] Foreign Application Priority Data

Feb. 27, 1983 [JP] Japan ................................. 58-31156

[51] Int. Cl.4 ........................................... G01R 23/16
[52] U.S. Cl. ................................ 324/77 B; 324/79 R; 364/485
[58] Field of Search ................. 324/77 R, 77 A, 77 B, 324/77 C, 77 D, 79 R, 57 DE, 57 N, 57 H; 364/484, 485, 580

[56] References Cited

U.S. PATENT DOCUMENTS

| 3,674,998 | 7/1972 | Benz | 324/77 B |
| 3,693,076 | 9/1972 | Nugent | 324/57 N |
| 4,243,935 | 1/1981 | McCool et al. | 324/77 B |
| 4,257,104 | 3/1981 | Martin | 364/485 |

Primary Examiner—Michael J. Tokar
Attorney, Agent, or Firm—Frishauf, Holtz, Goodman & Woodward

[57] ABSTRACT

A spectrum analyzer is provided with means for setting the level of an input signal applied to the mixer of the frequency converter circuit in the spectrum analyzer to an optimum level, i.e., such that the relative amounts of harmonic distortion and average noise in the displayed spectrum are balanced, the input level setting being established on the basis of the current reference level and resolution bandwidth settings.

2 Claims, 3 Drawing Figures

F I G. 1
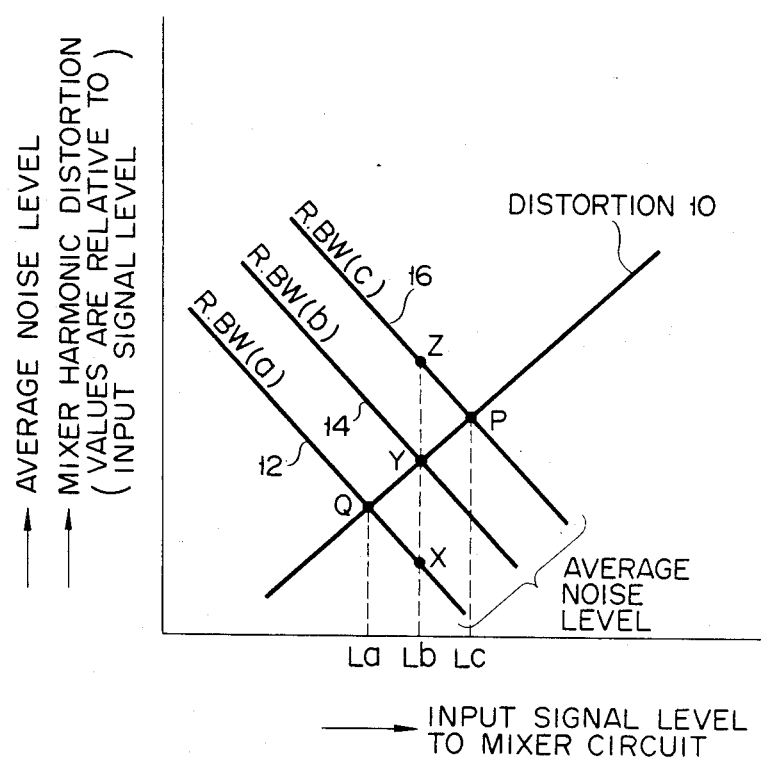

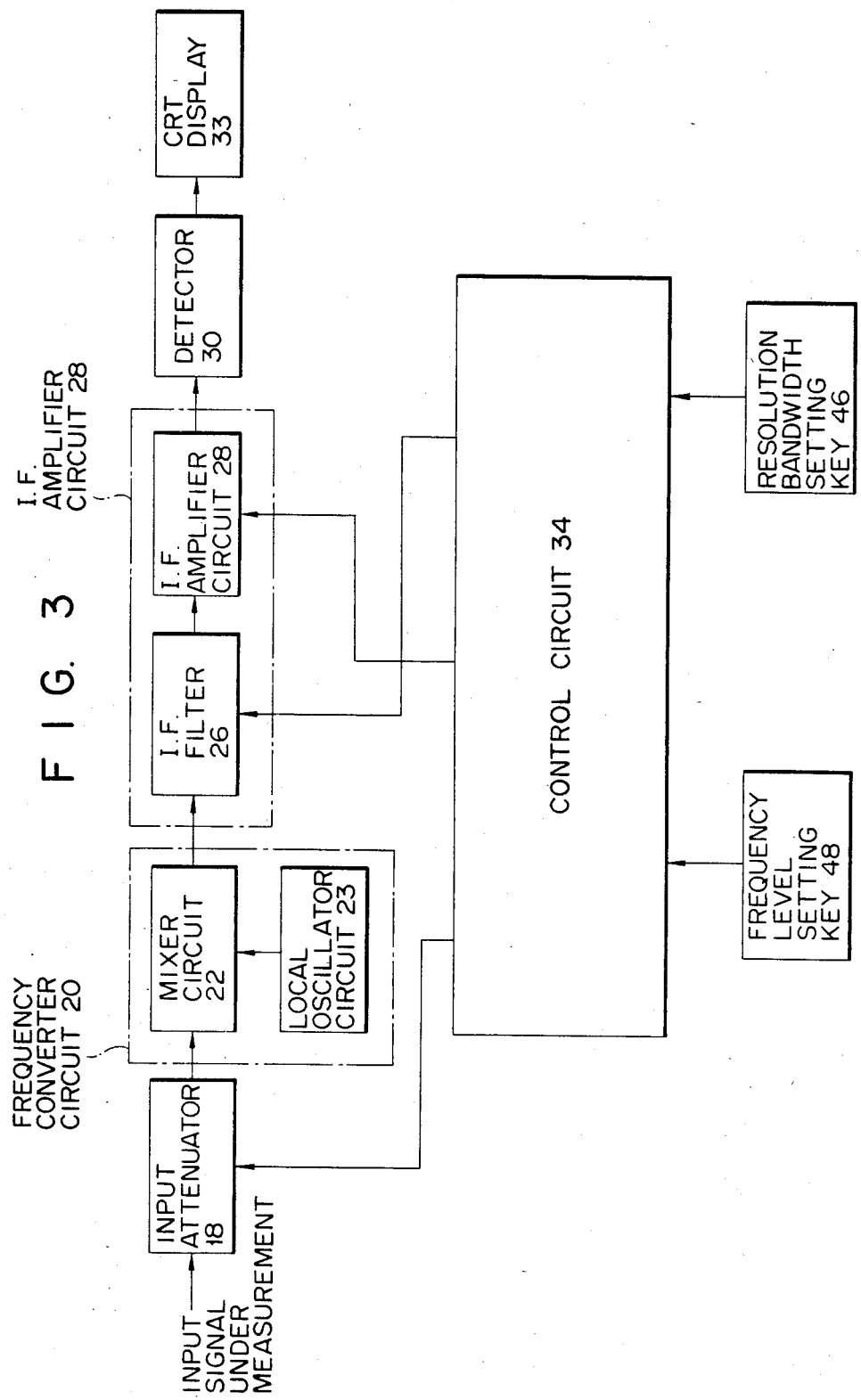

SPECTRUM ANALYZER

BACKGROUND OF THE INVENTION

A spectrum analyzer basically comprises a frequency converter circuit formed of a mixer which is coupled to receive an input signal under measurement and a local oscillator circuit whose output signal is also input to the mixer, together with means for sweeping the output signal frequency of the local oscillator circuit, an intermediate frequency amplifier circuit including a bandpass filter whose bandwidth determines the resolution bandwidth of the spectrum analyzer, an envelope detector circuit for detecting the output signal from the intermediate frequency amplifier circuit, and display means to display the detector output signal as the frequency spectrum of the input signal under measurement (or, more generally, a portion of that frequency spectrum). In addition, an input attenuator is provided coupled between the source of the input signal under measurement and the input of the mixer, to enable adjustment of the level of input signal applied to the mixer. The resolution bandwidth can be preset to a desired value by the user, together with the reference level. As used hereinafter, the term "reference level" denotes the level of input signal applied to the spectrum analyzer which will, with the currently set values of input attenuation and intermediate frequency amplification, be displayed at a predetermined reference position on the display device of the spectrum analyzer, for example at a specific signal amplitude scale graduation on a CRT display. The reference level is determined by the overall amount of gain from the point of input to the spectrum analyzer to the output from the intermediate frequency amplifier circuit, and can be altered by varying the amount of input attenuation or the amount of intermediate frequency amplification, or a combination of both of these factors.

For a given value of reference level, the average noise level of the output signal from the intermediate frequency amplifier circuit varies with the resolution bandwidth, i.e., as the resolution bandwidth is increased the average noise level increases and as the resolution bandwidth is decreased the average noise level decreases. The average noise level is also relatively a parameter of the input signal level applied to the mixer, that is to say as the input signal level is increased (for a given value of reference level) the average noise level is decreased relatively, and vice versa. On the other hand, as the input signal level applied to the mixer is increased, the amount of distortion, principally harmonic distortion, which is generated in the mixer will increase, while this distortion is decreased as the input signal level to the mixer is decreased. Thus, for any particular combination of reference level and resolution bandwidth, there is a corresponding combination of average noise level and harmonic distortion (measured relative to the input signal under measurement, e.g., each measured as a proportion of the displayed signal amplitude) which will be optimum, i.e., such that the average noise level and harmonic distortion components of the displayed spectrum are substantially equal. With these values of average noise level and harmonic distortion, the dynamic range of the spectrum analyzer is maximized, and therefore it is desirable to establish such values of average noise level and harmonic distortion as far as possible.

However with prior spectrum analyzers, no means for optimizing these parameters is provided. Instead, the level of input signal applied to the mixer is held to an approximately constant value by adjustment (usually performed manually) of the degree of input attenuation. That is to say, the reference level is set to be approximately equal to the level of the input signal under measurement. In some cases it may be possible for the user to vary the degree of input attenuation while holding a fixed reference level value, i.e., when a relatively narrow resolution bandwidth value has been set, then in order to increase the dynamic range of the spectrum analyzer, the user can increase the amount of input attenuation applied to the input signal under measurement so as to reduce the amount of harmonic distortion generated by the mixer, and can compensate for this increased attenuation be increasing the amount of intermediate frequency amplification such as to restore the original reference level value. Conversely, if a relatively broad resolution bandwidth value has been set, then the user can maximize the dynamic range by decreasing the amount of attenuation applied to the input signal under measurement so as to reduce the average noise level, and can compensate for this decreased input attenuation by increasing the amount of intermediate frequency amplification. However it will be apparent that such a procedure will require a considerable degree of experience in order to be effectively utilized, and that there is a considerable danger of measurement errors occurring.

There is therefore a requirement for a spectrum analyzer which is provided with means for automatically maintaining the level of attenuation applied to the input signal under measurement, taking into consideration the currently set values of reference level and resolution bandwidth, such as to establish optimum values of average noise level and harmonic distortion at all times.

SUMMARY OF THE INVENTION

A spectrum analyzer according to the present invention is provided with control circuit means which are operable to store desired values of reference level and resolution bandwidth, and which act in accordance with these values of reference level and resolution bandwidth to establish an intermediate frequency bandwidth corresponding to the desired resolution bandwidth and moreover to set the amount of attenuation applied to the mixer circuit of the spectrum analyzer such as to establish and optimum value of input signal level which provides maximum dynamic range of the operation of the spectrum analyzer, with regard to distortion produced in the mixer circuit (setting the upper limit to the dynamic range) and the average noise level present in the signal under measurement on output from the intermediate frequency filter (setting the lower limit to the dynamic range). The control circuit further acts to set the amount of intermediate frequency amplification, based on the amount of input attenuation which has thus been set, such as to establish the stored value of desired reference level.

Such a control circuit can be readily implemented in the form of a microprocessor provided with suitable RAM and ROM memory means, with the output control ignals therefrom being applied either directly in digital form or after conversion to analog form (depending upon the circuit means adopted for implementing variable input signal attenuation, variable intermediate frequency amplification and variable intermediate frequency bandwidth) to other sections of the spectrum analyzer. The desired values of reference level and resolution bandwidth can be input to such a microprocessor control circuit from switches actuated by keys.

With such a spectrum analyzer, optimum input signal level to the mixer circuit is ensured at all times, with no need for any special skill or knowledge on the part of the operator, and with the danger of errors in measurement operations being eliminated so that such a spectrum analyzer is convenient and easy to utilize.

BRIEF DESCRIPTION OF THE DRAWINGS

FIG. 1 is a graph illustrating the relationship between resolution bandwidth, average noise level, distortion generated in the mixer circuit, and input signal level for a spectrum analyzer;

FIG. 3 is a general block diagram of an embodiment of a spectrum analyzer according to the present invention which employs a microprocessor to implement a control circuit.

DETAILED DESCRIPTION OF THE PREFERRED EMBODIMENTS

Figure 2:
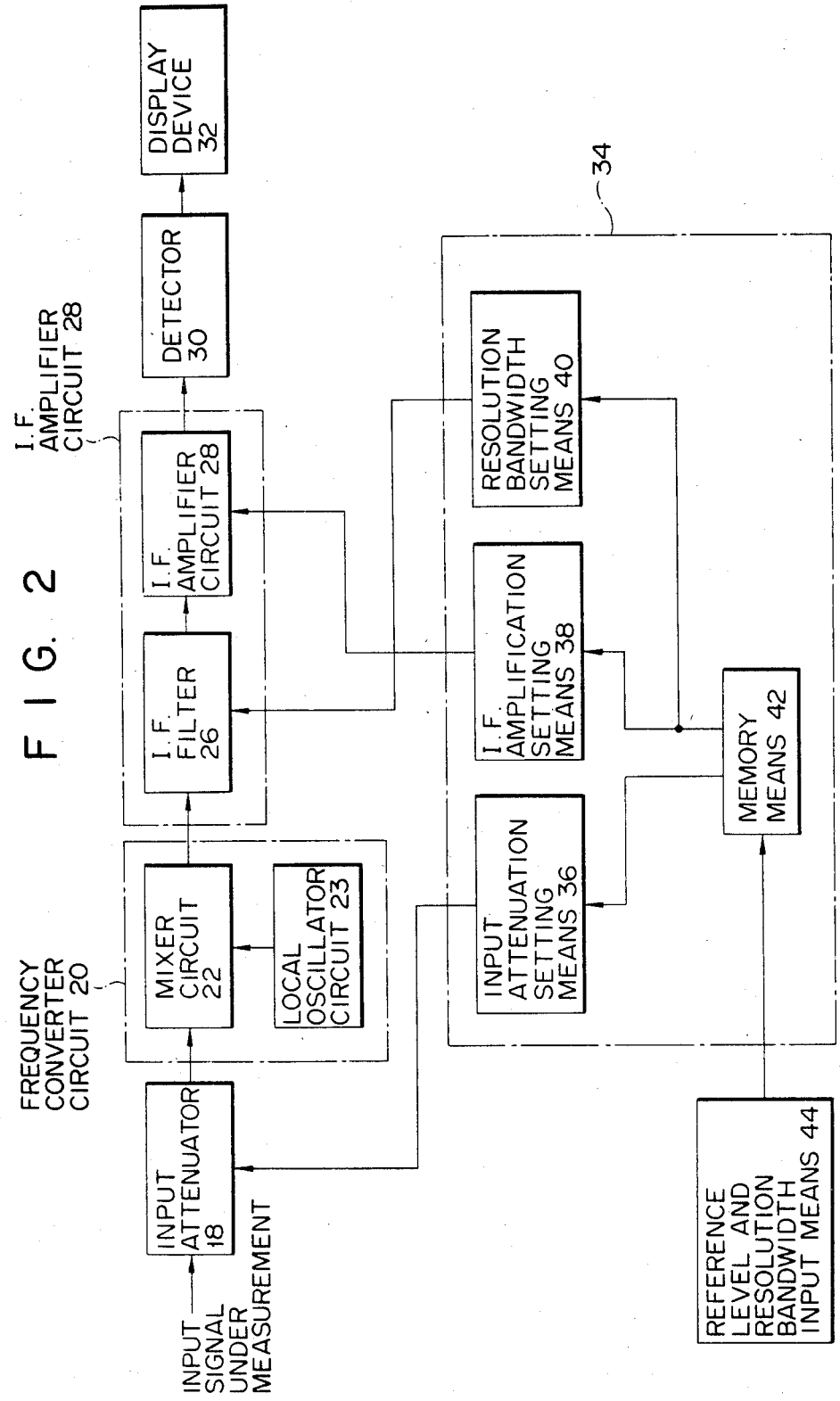
FIG. 2 is a general block diagram illustrating the basic configuration of a spectrum analyzer according to the present invention.

FIG. 1 is a graph to illustrate the relationships between resolution bandwidth, average noise level, mixer-generated harmonic distortion and mixer input signal level, for a spectrum analyzer set to a fixed value of reference level, with input signal level being plotted along the horizontal axis and noise and distortion levels being plotted along the vertical axis. Characteristic 10 illustrates the relationsihp between harmonic distortion generated in the mixer circuit (as measured with respect to the level of the input signal under measurement, e.g., as a proportion of the displayed amplitude of the input signal under measurement) and the input signal level applied to the mixer circuit. Characteristics 12, 14 and 16 respectively indicate the relationship between the average noise level (also measured with respect to the level of the input signal under measurement) and the input signal level applied to the mixer circuit for three different values of resolution bandwidth of successively increasing bandwidth. For each of these values of resolution bandwidth, the mixer input signal level of the point at which the corresponding average noise level characteristic intersects with the harmonic distortion characteristic (i.e., the input signal level for which the average noise level and harmonic distortion components of the displayed spectrum are equalized) is an optimum value of input signal level. That is to say, if it is assumed that the reference level which has been established corresponds to a level which is midway between the maximum and minimum levels of the spectrum of the input signal under measurement, then it will be apparent that maximum dynamic range will be attained when the degree of input attenuation is set such as to reduce that reference level value to a level corresponding to such a point of intersection. In other words, the values plotted along the horizontal axis of FIG. 1, designated as "input signal level to mixer circuit" actually represent the "input signal level of the mixer circuit which is determined by subtracting the input attenuation level from a reference level, i.e., the level of the input signal under measurement".

Thus for example, assuming that the resolution bandwidth has been preset to a value RBW(b) corresponding to characteristic 14, then the input attenuator of the spectrum analyzer should be adjusted such that the input signal level applied to the mixer circuit (defined as described above) is level Lb, i.e., corresponding to intersection Y between average noise level characteristic 14 and harmonic distortion characteristic 10. Assuming that the reference level has been suitably set for the range of input signal amplitudes expected, then this will ensure maximum dynamic range for measurement of the frequency spectrum of the input signal under measurement. The degree of intermediate frequency amplification should of course be adjusted such as to establish, in conjunction with this degree of input attenuation, the preset reference level value.

If however the resolution bandwidth is changed, for example, is narrowed from RBW(b) to RBW(a) so as to correspond to characteristic 12 in FIG. 1, but the degree of input attenuation is left unchanged, then the operating point will change from intersection Y to point X. The amount of harmonic distortion will remain unchanged, while the average noise level will drop. However the optimum operating point for this value of resolution bandwidth is intersection Q, and therefore it is necessary to reduce the input signal level applied to the mixer circuit (defined as described above) from level Lb to level La. To compensate for this change in input attenuation such as to maintain the preset value of reference level, it will be necessary to decrease the amount of intermediate frequency amplification to a suitable degree.

If on the other hand the resolution bandwidth is broadened from RBW(b) to RBW(c), corresponding to characteristic 16, then if the degree of input attenuation is left unchanged the operating point will change from point Y to point Z. In this case, the level of harmonic distortion will remain unchanged from that of point Y, but the average noise level will increase. The optimum combination of average noise level and harmonic distortion for resolution bandwidth RBW(c) to maximize the dynamic range now corresponds to point P, as shown, so that it is necessary to increase the input signal level applied to the mixer circuit (defined as described above) from level Lb to Lc, by suitably reducing the amount of attenuation applied to the input signal under measurement. The intermediate frequency amplification must then be reduced by a suitable amount such as to maintain the preset value of reference level.

With a spectrum analyzer according to the present invention, the above operations for setting the level of the input signal under measurement applied to the mixer circuit to an optimum value, by adjustment of the degree of input attenuation, and correspondingly altering the amount of intermediate frequency amplification such as to maintain the preset reference level value, are preformed automatically, with no need for manual adjustment by the operator. FIG. 2 shows the general configuration of a spectrum analyzer according to the present invention, in simplified block circuit diagram form. In FIG. 2, numeral 18 denotes an input attenuator, coupled to receive the input signal under measurement and controllable to apply a requisite degree of attenuation to the input signal under measurement before transfer to the input of a mixer circuit 22 within a frequency converter circuit 20. Frequency converter circuit 20 further comprises a local oscillator circuit 23, for applying a swept frequency signal to mixer circuit 22. The resultant intermediate frequency signal from mixer circuit 22 is transferred through a band-pass intermediate frequency filter 26 in an intermediate frequency amplifier section 24, whose bandwidth is controllable and determines the resolution bandwidth of the spectrum analyzer, and then is amplified by an intermediate frequency amplifier circuit 28, whose gain is controllable. The amplified output signal from intermediate frequency amplifier circuit 28 is applied to a detector circuit 30, and the detected output signal is applied to a display device 32 to be displayed as a portion of the frequency spectrum of the input signal under measurement.

The degree of input attenuation, the resolution bandwidth and the intermediate frequency amplification are established by control signals generated by a control circuit 34, in accordance with a reference level value and a resolution bandwidth value which are input to control circuit 34 from input means 44 and stored therein in memory means 42. The control signals for establishing the input attenuation, resolution bandwidth and intermediate frequency amplification are respectively output from input attenuation setting means 36, resolution bandwidth setting means 40 and intermediate frequency amplification setting means 38 in control circuit 34, and can be in digital or analog form, depending upon the particular configurations adopted for input attenuator 18, intermediate frequency filter 26 and intermediate frequency amplifier circuit 28.

The operation of the spectrum analyzer of FIG. 2 is essentially as described above with reference to FIG. 1. That is to say, after the operator sets in desired values of reference level and resolution bandwidth using input means 44, which are stored in memory means 42, then resolution bandwidth setting means 40 produces control signals based on the stored value of resolution bandwidth for activating intermediate frequency filter 26 to establish a corresponding value of intermediate frequency bandwidth (e.g., by switching into circuit a suitable number of filter sections). In addition, based on the stored values of resolution bandwidth and reference level, input attenuation setting means 36 generates control signals which set the attenuation provided by input attenuator 18 such as to establish the optimum input signal level to be input to mixer circuit 22, as described above with reference to FIG. 1. Based on this value of input attenuation, intermediate frequency amplification setting means 38 generates control signals which set the degree of amplification provided by intermediate frequency amplifier circuit 28 such as to establish the reference level value that has been stored in memory means 42. In this way, the input attenuation and intermediate frequency amplification provided by the spectrum analyzer are automatically set to values which provide the maximum dynamic range, for the particular value of resolution bandwidth which is currently set. If the resolution bandwidth is altered, then the input attenuation is automatically altered such as to restore the optimum value of input signal level applied to mixer circuit 22, and a corresponding change is made to the intermediate frequency amplification so as to maintain the preset value of reference level, i.e., to hold the overall gain from input to attenuator 18 to output from intermediate frequency amplifier circuit 28 at a fixed value corresponding to that reference level.

FIG. 3 is a general block circuit diagram of an embodiment of a spectrum analyzer according to the present invention in which control circuit 34 is implemented as a combination of a microprocessor and RAM memory serving as memory means 42 in FIG. 2, indicated as block 34. Input means 44 of FIG. 2 are implemented as key-operated switches, designated as reference level setting key 48 which is used to input the desired value of reference level and resolution bandwidth setting key 46 which is used to input the desired resolution bandwidth. Since the functions required from microprocessor as described above can readily be provided by various well-known techniques, no detailed description of the configuration will be given. A CRT display 33 constitutes the display device in this embodiment.

From the above description it will be apparent that a spectrum analyzer according to the present invention is automatically set to provide the maximum degree of dynamic range at all times, without requiring special skill or experience of the user, and therefore is a significant improvement over prior art types of spectrum analyzer which require manual adjustment of input attenuation in order to establish the maximum dynamic range and therefore optimum operation.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. A spectrum analyzer, comprising:
   frequency converter circuit means comprising a local oscillator and a mixer coupled to receive an output signal from said local oscillator circuit and an input signal whose spectrum is to be displayed, for converting said input signal to an intermediate frequency signal;
   attenuator means for varying the level of said input signal at input to said mixer circuit;
   band-pass filter means coupled to receive said intermediate frequency signal;
   intermediate frequency amplifier circuit means for amplifying said intermediate frequency signal after output from said band-pass filter means;
   detector circuit means coupled to receive said intermediate frequency signal from said intermediate frequency amplifier circuit means, for producing a detection signal;
   display means for displaying said detection signal;
   control circuit means comprising memory means for storing a reference level value and a resolution bandwidth value, input attenuation setting means for generating control signals which are applied to said input attenuator means to set the degree of attenuation provided by said input attenuator means such as to establish an optimum level of said input signal under measurement at input to said mixer circuit based upon said stored values of resolution bandwidth and reference level, intermediate frequency amplification setting means for producing control signals which are applied to said intermediate frequency amplifier circuit means for setting the degree of amplification provided thereby such as to correspond, in conjunction with said input attenuation, to said stored reference level value, and resolution bandwidth setting means for producing control signals which are applied to said band-pass filter means for setting the bandwidth thereof to correspond to said stored value of resolution bandwidth; and input means for inputting said resolution bandwidth and reference level values to said control circuit means to be stored in said memory means.

2. A spectrum analyzer according to claim 1, in which said control circuit means comprises a combination of a microprocessor and random-access memory circuit means.

* * * * *